United States Patent
Williams

(10) Patent No.: US 10,845,395 B2
(45) Date of Patent: Nov. 24, 2020

(54) INTRINSICALLY SAFE ZENER DIODE BARRIER WITH INDICATION

(71) Applicant: Honeywell International Inc., Morris Plains, NJ (US)

(72) Inventor: Michael Williams, Coquitlam (CA)

(73) Assignee: Honeywell International Inc., Morris Plains, NJ (US)

( * ) Notice: Subject to any disclaimer, the term of this patent is extended or adjusted under 35 U.S.C. 154(b) by 109 days.

(21) Appl. No.: 15/891,808

(22) Filed: Feb. 8, 2018

(65) Prior Publication Data

US 2019/0242928 A1    Aug. 8, 2019

(51) Int. Cl.
| | | |
|---|---|---|
| *G01R 19/00* | (2006.01) | |
| *G01R 19/15* | (2006.01) | |
| *G01R 19/165* | (2006.01) | |
| *H02H 9/04* | (2006.01) | |
| *G01R 31/28* | (2006.01) | |
| *H02H 9/00* | (2006.01) | |
| *H02H 1/00* | (2006.01) | |
| *G01R 31/26* | (2020.01) | |
| *G01R 31/27* | (2006.01) | |

(52) U.S. Cl.
CPC ......... *G01R 19/0053* (2013.01); *G01R 19/15* (2013.01); *G01R 19/16523* (2013.01); *G01R 31/2827* (2013.01); *H02H 9/008* (2013.01); *H02H 9/042* (2013.01); *G01R 31/2633* (2013.01); *G01R 31/275* (2013.01); *H02H 1/0007* (2013.01); *H02H 9/041* (2013.01)

(58) Field of Classification Search
None
See application file for complete search history.

(56) References Cited

U.S. PATENT DOCUMENTS

| | | | | |
|---|---|---|---|---|
| 3,973,170 A | * | 8/1976 | Hogan | H02H 9/008 361/41 |
| 4,777,375 A | * | 10/1988 | Bozzuto, Jr. | H02H 9/008 250/229 |
| 4,954,923 A | * | 9/1990 | Hoeflich | H02H 9/008 361/111 |
| 5,130,760 A | | 7/1992 | Matzen et al. | |

(Continued)

FOREIGN PATENT DOCUMENTS

| | | |
|---|---|---|
| WO | WO9956374 A1 | 11/1999 |
| WO | WO02095895 A1 | 11/2002 |
| WO | 2011058318 A1 | 5/2011 |

OTHER PUBLICATIONS

Lee, J. S. E. et al., Building a Safe and Robust Industrial System with Avago Technologies' Optocouplers, Avago Technologies, Jun. 24, 2015, 8 pages.

(Continued)

*Primary Examiner* — Paresh Patel

(57) ABSTRACT

A circuit device can be implemented, which includes a zener diode barrier composed of one or more zener diodes. The circuit device further includes one or more detection circuits electronically in series with the zener diode (or zener diodes) of the zener diode barrier. The zener diode barrier functions as an IS (Intrinsically Safe) barrier. The detection circuit (or circuits) facilitates the production of detailed information concerning different types of events detected by the detection circuit(s).

12 Claims, 4 Drawing Sheets

(56) References Cited

U.S. PATENT DOCUMENTS

| | | | | |
|---|---|---|---|---|
| 5,225,813 | A * | 7/1993 | Raub, Sr. | B63B 27/24 |
| | | | | 340/623 |
| 5,365,420 | A * | 11/1994 | Cadman | G05F 1/56 |
| | | | | 363/50 |
| 6,002,144 | A | 12/1999 | Oishi | |
| 7,463,470 | B2 * | 12/2008 | Lark | H02H 9/008 |
| | | | | 361/111 |
| 7,468,600 | B2 | 12/2008 | Lin | |
| 7,741,883 | B2 | 6/2010 | Fuller et al. | |
| 8,110,945 | B2 | 2/2012 | Simard et al. | |
| 8,492,866 | B1 | 7/2013 | Anderson et al. | |
| 8,873,241 | B2 | 10/2014 | Muldowney et al. | |
| 8,993,392 | B2 | 3/2015 | Xia et al. | |
| 9,343,899 | B2 * | 5/2016 | Kemp | H02H 9/045 |
| 9,361,247 | B1 | 6/2016 | Kumar Kn et al. | |
| 95,432,932 | | 1/2017 | Tsuchiko | |
| 9,735,291 | B1 | 8/2017 | Chiou et al. | |
| 2001/0033469 | A1 * | 10/2001 | Macbeth | H02H 1/0015 |
| | | | | 361/42 |
| 2004/0251951 | A1 | 12/2004 | Beck | |
| 2006/0164780 | A1 * | 7/2006 | Lark | H02H 9/008 |
| | | | | 361/118 |
| 2010/0067156 | A1 * | 3/2010 | Lark | H02H 9/008 |
| | | | | 361/57 |
| 2012/0167969 | A1 | 7/2012 | Petti | |
| 2016/0254390 | A1 | 9/2016 | Eguchi et al. | |
| 2017/0148777 | A1 | 5/2017 | Bono et al. | |
| 2017/0148926 | A1 | 5/2017 | Simola et al. | |
| 2017/0287894 | A1 | 10/2017 | Kuo et al. | |

OTHER PUBLICATIONS

Zener Theory and Design Considerations Handbook, HBD854/D Rev. 1, Dec. 2017, 54 pages.
Zener diode—Wikipedia, printed Jan. 13, 2018, 6 pages.
How does a Zener barrier work? Extech Safety Systems, Extech. co.za, printed Jan. 3, 2018, 4 pages.
Extended European Search Report dated Jun. 27, 2019 for corresponding EP Application No. 19154347.9.

* cited by examiner

INTRINSICALLY SAFE ZENER DIODE BARRIER WITH INDICATION

TECHNICAL FIELD

Embodiments are generally related to Zener diode circuits and IS (Intrinsic Safety) standards used in industrial plants and hazardous environments such as manufacturing facilities.

BACKGROUND

In general, intrinsic safety (IS) is a protection technique for the safe operation of electronic equipment in explosive atmospheres and under irregular operating conditions. The concept was developed for safe operation of process control instrumentation in hazardous areas such as, for example, North Sea gas platforms. As a discipline, it is an application of inherent safety in instrumentation.

The theory behind intrinsic safety involves ensuring that the available electrical and thermal energy in the system is always low enough so that an ignition of a hazardous atmosphere does not occur. This can be achieved by ensuring that only low voltages and currents enter the hazardous area, and that Zener safety barriers protect all electric supply and signal wires. Sometimes an alternative type of barrier known as a galvanic isolation barrier may be used.

In normal uses, electrical equipment often creates internal tiny sparks in switches, motor brushes, connectors, and in other places. Such sparks can ignite flammable substances present in air. A device termed intrinsically safe is designed to not contain any components that produce sparks or which can hold enough energy to produce a spark of sufficient energy to cause an ignition. For example, during marine transfer operations when flammable products are transferred between the marine terminal and tanker ships or barges, two-way radio communication needs to be constantly maintained in case the transfer needs to stop for unforeseen reasons such as a spill. The United States Coast Guard requires that the two-way radio must be certified as intrinsically safe.

Another aspect of intrinsic safety is controlling abnormal small component temperatures. Under certain fault conditions (such as an internal short inside a semiconductor device), the temperature of a component case can rise to a much higher level than in normal use. Safeguards, such as current limiting by resistors and fuses, must be employed to ensure that in no case can a component reach a temperature that could cause auto ignition of a combustible atmosphere.

No single field device or wiring is intrinsically safe by itself (except for battery-operated, self-contained devices), but is intrinsically safe only when employed in a properly designed IS system. All systems are provided with detailed instructions with the proper instructions to ensure safe use.

Intrinsic safety is a requirement that may be applicable to devices that are being operated in areas with flammable gases or fuels. It means that the device is incapable of igniting those gases. In short, an intrinsically safe piece of equipment won't ignite flammable gases. ISA-RP12-6, for example, defines intrinsically safe equipment as "equipment and wiring which is incapable of releasing sufficient electrical or thermal energy under normal or abnormal conditions to cause ignition of a specific hazardous atmospheric mixture in its most easily ignited concentration."

Many ultra-ruggedized mobile computers will include intrinsically safe (IS) specifications or approval ratings. Understanding IS approval ratings can be a difficult proposition for even the most informed user. Intrinsically safe areas are hazardous environments where flammable gases, vapors, and liquids are stored and manufactured. These areas are prevalent in many of today's manufacturing facilities including chemical plants, paint manufacturers, oil refineries, textile mills, etc.

Each designated hazardous environment has specific certification requirements for all equipment used in the IS area. Intrinsically safe equipment must carry a label, which specifies the exact IS rating for the equipment and the name of the NRTL (Nationally Recognized Testing Laboratory) who tested it. Testing laboratories have very stringent certification requirements that vary according to the level of IS approval desired. Therefore, each intrinsically safe device is certified for different levels of IS approval and can only be used in specific hazardous environments. The bottom line is that close attention must be given to the specific IS approval certification for each individual piece of equipment. Just because a device has an IS rating does not mean that the device can be used in any IS area.

IS approval certifications are made up of multiple classes, groups, and divisions that correspond to the specific hazardous environment a device is approved to operate in. Each class consists of two divisions and certain classes have multiple groups. For example, Class I includes flammable gases, Class II includes flammable dust, and Class III includes flammable fibers. Each class has two divisions. Division 1 includes environments where explosive material is present in the air at all times. Division 2 includes environments where explosive material is stored in sealed containers, and explosive material is only present for short time intervals (e.g., when a failure occurs or during maintenance). Also, Classes I and II are broken down into groups that correspond to the explosive properties of each specific material. For example, Group A includes Acetylene and Group E includes aluminum dust. In addition, IS approval ratings differ significantly from country to country. A device that is IS certified for use in the U.S. may not be certified, for example, in Europe and vice versa.

Zener diode barriers can be utilized in the context of IS devices and systems to limit voltage in, for example, fault conditions specified by IS standards, so as to suppress transients, surges and other damaging events. There are presently, however, no practical solutions for detecting information related to the events that Zener diodes are designed to prevent. The ability to detect information concerning such events would be extremely helpful in improving IS applications and ensuring the infallibility of Zener diode barriers utilized in industrial and hazardous environments.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved IS (Intrinsically Safe) circuit for use in industrial plants and hazardous environments.

It is another aspect of the disclosed embodiments to provide for an improved zener diode barrier for IS applications including limiting voltage in fault conditions specified by IS safety standards.

It is yet another aspect of the disclosed embodiments to provide for the use of detection circuits in association with a zener diode barrier for detecting different types of events.

It is still another aspect of the disclosed embodiments to provide for a circuit device that detects different types of events for preventive maintenance, logging and maintenance over voltage events, and fault detection which would otherwise go undetected.

The aforementioned aspects and other objectives and advantages can now be achieved as described herein. In an example embodiment, a circuit device can be implemented that includes a zener diode barrier composed of one or more zener diodes. The circuit device further includes one or more detection circuits electronically in series with the zener diode (or zener diodes) of the zener diode barrier. The zener diode barrier functions as an IS (Intrinsically Safe) barrier. In addition, the detection circuit (or circuits) facilitates the production of detailed information concerning different types of events detected by the detection circuit(s).

In some example embodiments, the aforementioned detection circuit can include a current transformer based detection circuit composed of a current transformer that detects short pulses when the zener diode (or zener diodes) initially turns on. Such a current transformer can include a transformer coil that is rated for a maximum fault current as specified by an IS safety standard. In other example embodiments, the aforementioned detection circuit can also include an opto-coupler based detection circuit that includes an opto-coupler that detects a period during which the zener diode is conducting electricity. Such an opto-coupler can be rated for a maximum fault current as specified by an IS safety standard. In still other example embodiments, the aforementioned detection circuit can be configured as a shunt based detection circuit.

In yet another example embodiment, the circuit device can include two or more redundant circuit paths in which different types of circuits are located to detect different types of events such as, for example, long durations faults, surges that last over a particular length of time, fast transients, and different amounts of current.

A zener diode barrier topology can thus be configured with a detection circuit in series with each zener diode. The detection circuit can be current transformer based, opto-coupler based, shunt based, or any other topology that can be designed to be infallible (i.e., to maintain the IS barrier ratings according to the safety standards). A current transformer can be used to detect short pulses when the zener diode first turns on. The transformer coil is preferably rated for the maximum fault current as specified by IS safety standards.

An opto-coupler may be used to detect the period while the zener diode is conducting. Such an approach may not detect when the zener diode first turns on due to a minimum current threshold for detection, if the rating of the opto-coupler must be rated for the maximum fault current as specified by IS safety standards to remain infallible. IS barriers typically need 2 or 3 redundant paths to be infallible depending on the IS rating of the device. Such barriers do not need, however, to be identical.

This allows an opportunity to use different circuits in each redundant path, if desired, and designed to detect different types of events. One circuit could be used to detect only long duration faults, another for surges that last over a particular length of time, and a third to detect very fast transients. Such circuits can also be configured to detect different amount of current instead of duration, while providing information on the severity. Each circuit must be designed to be infallible, so the overall topology provides an IS barrier, but each leg also can provide detection of different events which results in more detailed information available about such detected events.

In addition, in some example embodiments, the output of each detection circuit can be used by an embedded processor for further processing, or made available for an external device to monitor.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. As used herein, the term "and/or" includes any and all combinations of one or more of the associated listed items.

Reference will be made in detail to the disclosed embodiments (exemplary embodiments) of the invention, examples of which are illustrated in the accompanying drawings, and which may be preferred or alterative embodiments. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected.

Figure 1:
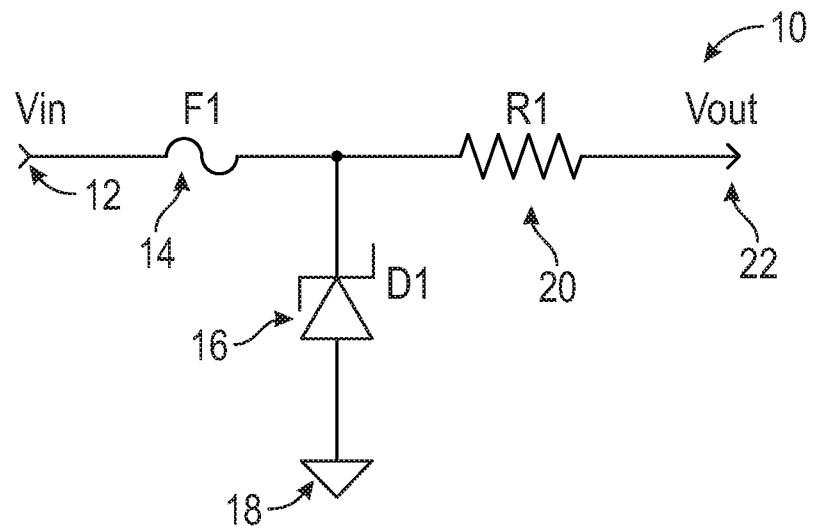
FIG. 1 illustrates a schematic diagram of a circuit that provides a basic zener diode barrier.

FIG. 1 illustrates a schematic diagram of a circuit 10 that provides a basic zener diode barrier. The circuit 10 shown in FIG. 1 includes a zener diode 16 that is electrically connected to ground 18, and also to an inductor fuse 14 and a resistor 20. The resistor 20 in turn provides an output voltage ($V_{out}$) 22 and the inductor fuse 14 can be electrically connected to an input voltage ($V_{in}$) 12. The zener diode 16 is a particular type of diode, unlike a normal diode, which allows a current to flow not only from its anode to its cathode, but also in the reverse direction, when the so-called "Zener voltage" is reduced. The zener diode 16 has a highly doped p-n junction. The zener diode 16 is utilized to regulate voltage in circuit 10 to a maximum safe value as specified by an IS safety standard.

The circuit 10 shown in FIG. 1 can thus provide the basic building block of a zener diode barrier. Such a zener diode barrier can be adapted for use with IS (Intrinsic Safety) applications to limit voltage even in fault conditions per safety standards. A zener diode barrier can also be simultaneously used to suppress events such as transients, surges, and provide protection from indirect lightning strikes, thus protecting the equipment attached to the zener diode barrier. As will be discussed in greater detail herein, embodiments can be implemented to provide for the detection of such events for preventative maintenance, logging and information concerning over voltage events, and fault detection, which would otherwise go undetected.

In accordance with the disclosed embodiments, detection circuitry can be added to the circuit 10 to provide several benefits including the use of existing devices and the provision of information that can be helpful for determining the health of the device and the network the device may connected to, and also for determining if potentially harmful effects are occurring (and how often). Such an approach can also be utilized to detect failures that would otherwise go unnoticed (e.g., a power supply failing to attain a high voltage). The implementation of such embodiments can result in recommendations for preventative maintenance, after surges/lightning strikes, or after short transients are detected, for example, or to check voltage levels if a permanent fault is detected. Such embodiments can also be used to change the operating state of the product during surge events to potentially decrease the probability of early failure.

Figure 2:
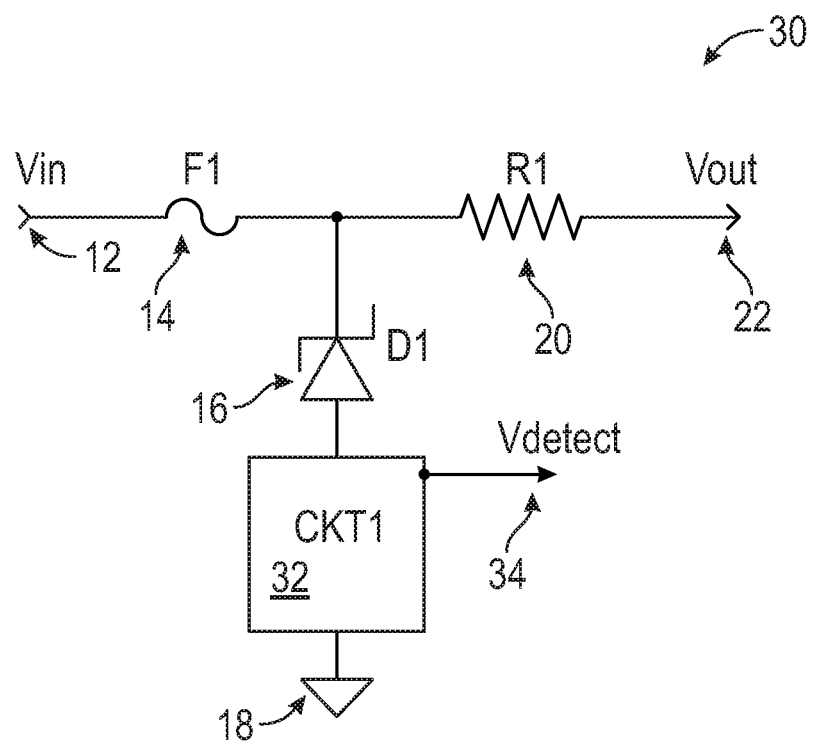
FIG. 2 illustrates a schematic diagram of a circuit that provides for zener diode barrier current detection, in accordance with an example embodiment.

FIG. 2 illustrates a schematic diagram of a circuit 30 that provides for zener diode barrier current detection, in accordance with an example embodiment. The circuit 30 shown in FIG. 2 is a modified form of circuit 10 depicted in FIG. 1. Note that in FIGS. 1-6, similar or identical parts or elements are generally indicated by identical reference numerals. Thus, the circuit 30 shown in FIG. 2 includes the zener diode 16, the fuse 14, the resistor 20, the ground 18, and so on.

Circuit 30, however, further includes a detector circuit 32 (also labeled "CKT1") that is connected electronically to ground 18 and the zener diode 16 and provides a detection voltage ($V_{detect}$) 34. The circuit 30 shown in FIG. 2 provides the basic building block a zener diode barrier current detection circuit. The circuit 32 is shown generically in FIG. 2, but as will be discussed in greater detail below. The circuit 32 can be implemented as, for example, a current transformer circuit (e.g., see FIG. 3), an opto-coupler circuit (e.g., see FIG. 4), other circuit configurations such as the dual redundant zener diode arrangement shown in FIG. 5, and the triple redundant zener diode arrangement depicted in FIG. 6.

Figure 3:
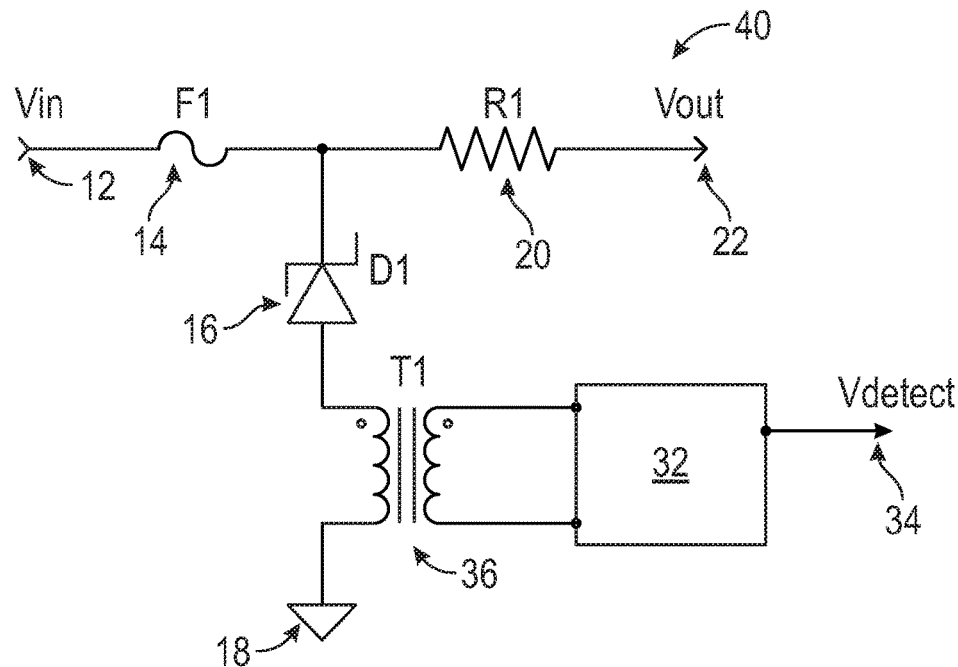
FIG. 3 illustrates a schematic diagram of a circuit that includes a current transformer, in accordance with an example embodiment.

FIG. 3 illustrates a schematic diagram of a circuit 40 that includes a current transformer 36, in accordance with an example embodiment. The circuit 40 shown in FIG. 3 is similar to the circuit depicted in FIG. 3, the difference being the presence of the current transformer 36 that is electronically connected to circuit 32, ground 18, and the zener diode 16. The use of the current transformer 36 configures the circuit 40 as a current transformer based circuit. The current transformer 36 can be used to detect short pulses when the zener diode 16 first turns on. The current transformer 36 includes a transformer coil that is rated for the maximum fault current as specified by IS safety standards.

Figure 4:
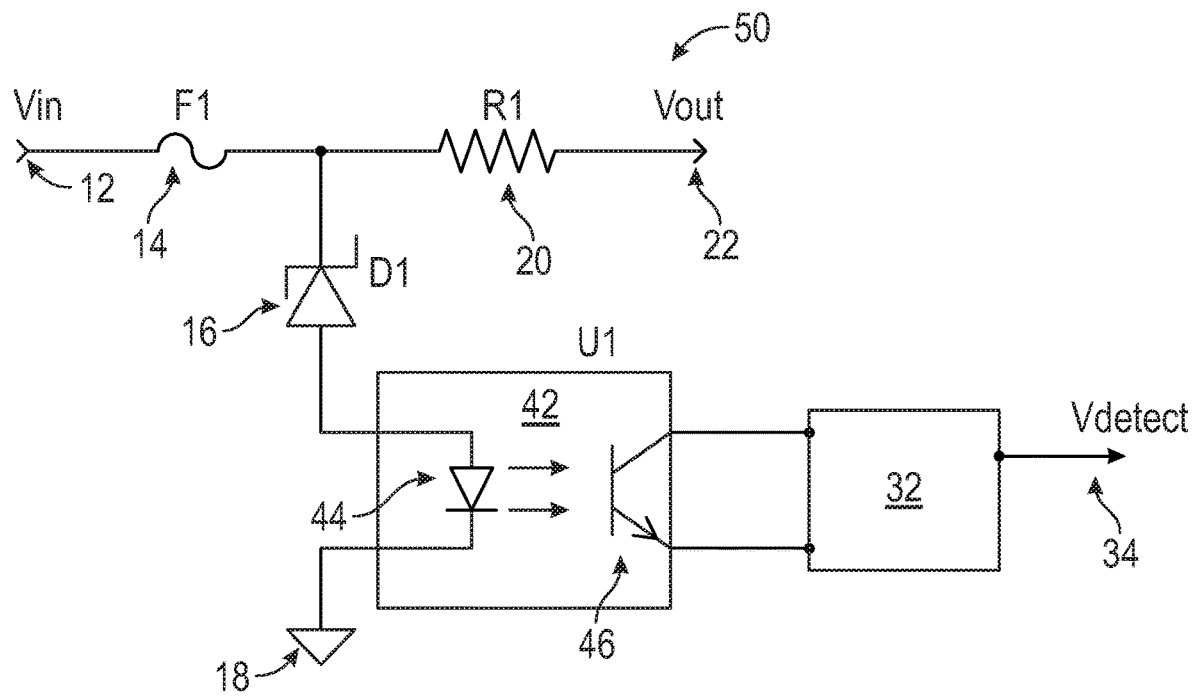
FIG. 4 illustrates a schematic diagram of a circuit that includes an opto-coupler, in accordance with an example embodiment.

FIG. 4 illustrates a schematic diagram of a circuit 50 that includes an opto-coupler 42, in accordance with an example embodiment. The circuit 50 shown in FIG. 4 is similar to the circuit 30 shown in FIG. 2, the difference being the presence of the opto-coupler 42 (also referred to as an optocoupler, photo coupler, opto-isolator, or optical isolator) which includes a diode 44 and communicates optically with a transistor 46. The opto-coupler 42 transfers electrical signals between two isolated circuits using light, in the case between the zener diode 16 and the circuit 32. The transistor 46 of the opto-coupler 42 is connected electronically to the circuit 32, and the diode 44 of the opto-coupler 42 is connected electronically to ground 18 and to the zener diode 16. The transistor 46 can be implemented as a photo-transistor. The opto-coupler 42 is used to detect the period while the zener diode 16 is conducting. Note that in some situations this method may not detect when the zener diode 16 first turns on due to a minimum current threshold for detection. The IS rating of the opto-coupler 42 should preferably be rated for the maximum fault current as specified by the IS safety standards to remain infallible. In some example embodiments, the diode 44 may be an LED (Light Emitting Diode) configured in the same package with the phototransitor 46.

Figure 5:
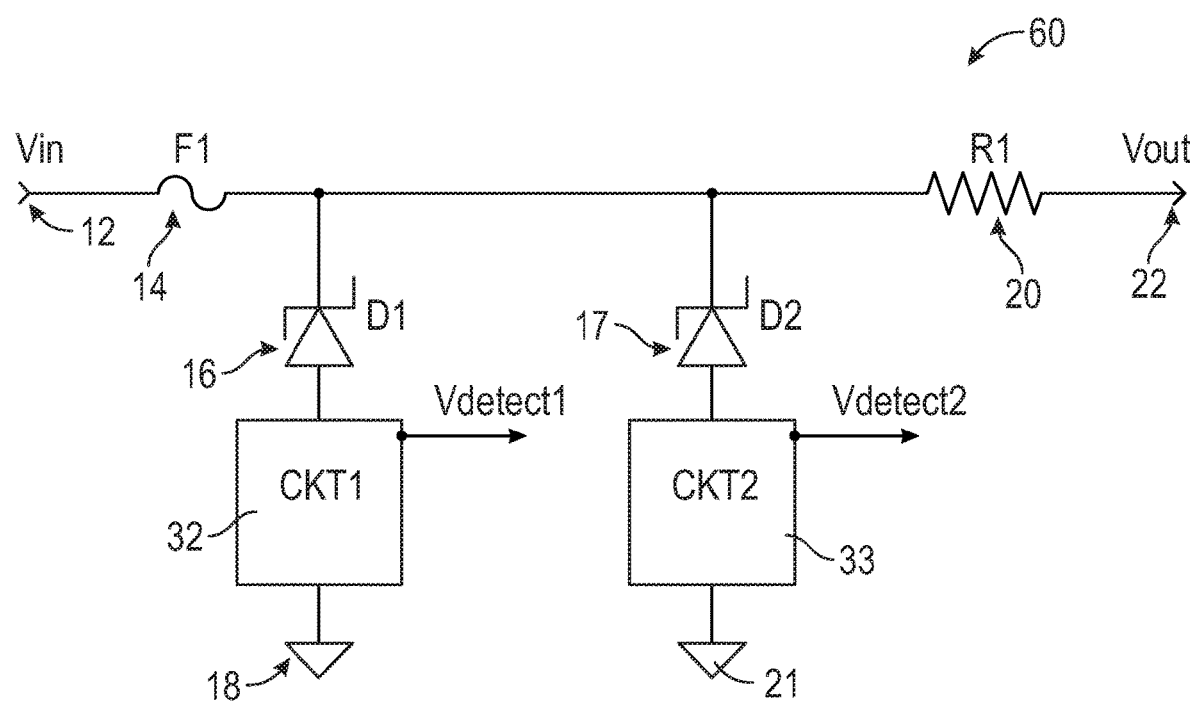
FIG. 5 illustrates a schematic diagram of a circuit that includes dual redundant zener diodes for IS safety rules, in accordance with an example embodiment.

FIG. 5 illustrates a schematic diagram of a circuit 60 that includes dual redundant zener diodes 16 and 17 for IS safety rules, in accordance with an example embodiment. The circuit 60 further includes a second detection circuit 33 that is electronically connected to ground 21 and the second zener diode 17. A voltage $V_{decet1}$ is produced by the first circuit 32 and a voltage $V_{detect2}$ is produced by the second circuit 33.

Figure 6:
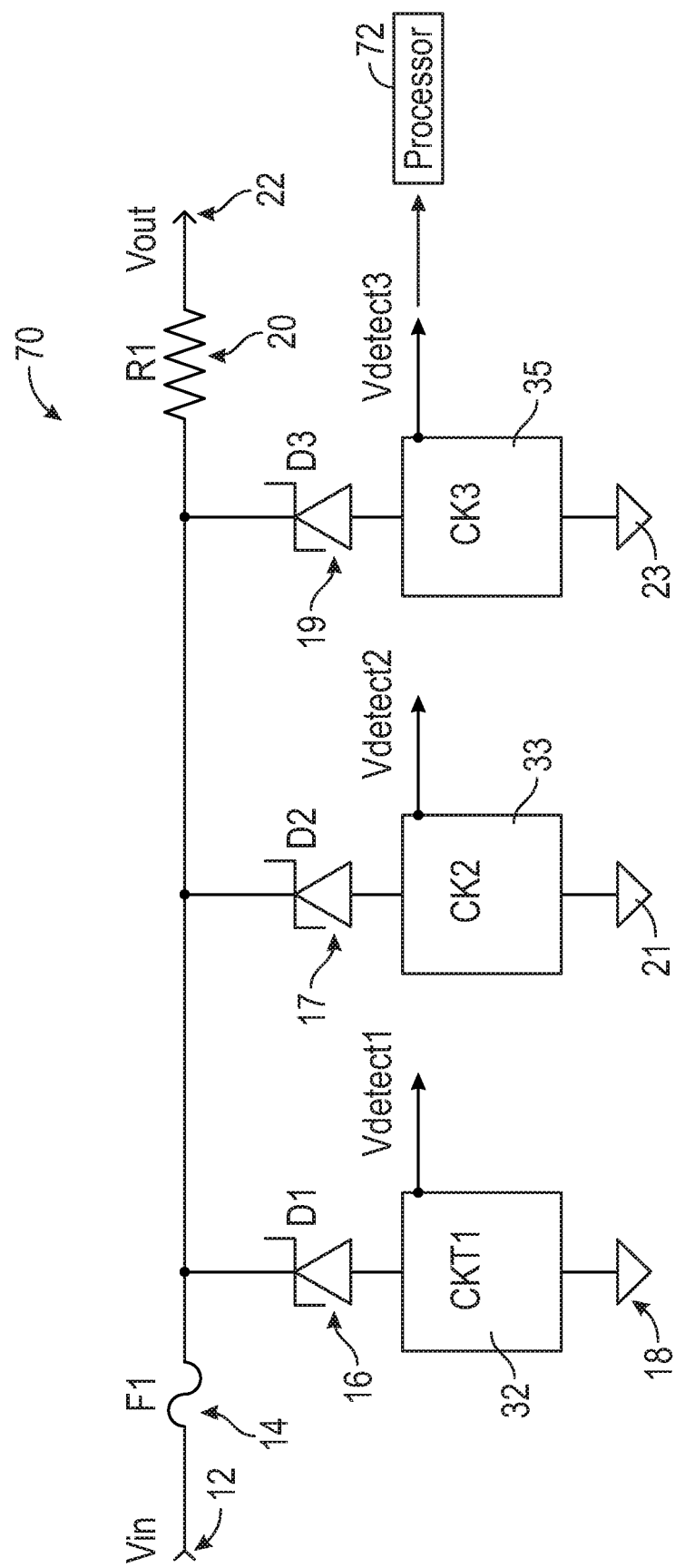
FIG. 6 illustrates a schematic diagram of a circuit that includes triple redundant zener diodes for IS safety rules, in accordance with an example embodiment.

FIG. 6 illustrates a schematic diagram of a circuit 70 that includes triple redundant zener diodes 16, 17, and 19 for IS safety rules, in accordance with an example embodiment. The circuit 70 further includes a third detection circuit 35 that is connected electronically to ground 23 and to the third zener diode 19. A voltage $V_{detect3}$ is produced by the third circuit 35.

IS barriers may require 2 or 3 redundant paths to be infallible, depending on the IS rating of the device. Such IS barriers, however, do not need to be identical. This allows for the opportunity to use different circuits in each redundant path, if desired, which are designed to detect different types of events. One circuit 32, for example, could be used to detect only long duration faults, while another circuit 33 may be utilized to detect surges that last over a particular length of time. A third circuit 35, for example, may employed to detect very fast transients. Such circuits 32, 33, and 35 can be designed to detect different amounts of current instead of a duration, while providing information regarding the severity of such events. Thus, in some example embodiments, the first circuit 32 may be implemented as a current-transformer circuit (such as shown in FIG. 3) and the second circuit 33 can be implemented as an opto-coupler circuit (such as shown in FIG. 4), and so on.

Each circuit is preferably designed to be infallible so that the overall circuit topology provides an IS barrier, but each leg of the circuit provides for the detection of different events, which results in more detailed information available concerning the detected events. Note that the output of each detection circuit such as $V_{detect1}$, $V_{detect2}$, and $V_{detect3}$ can be used by an embedded processor 72 for further processing or made available to external device to monitor. Note that the embedded processor 72 can be implemented as a microprocessor that is used in an embedded system. These processors are usually smaller, use a surface mount form factor, and consume less power. The embedded processor 72 can be, for example, an ordinary microprocessor or a microcontroller. Microcontrollers have more peripherals on the chip.

Based on the foregoing, it can be appreciated that a number of example embodiments, preferred and alternative, are disclosed. For example, in one embodiment, a circuit device can be implemented, which includes a zener diode barrier having one or more zener diodes; and one or more detection circuits electronically in series with zener diode (or zener diodes) of the zener diode barrier. The zener diode barrier generally constitutes an IS (Intrinsically Safe) barrier, such that detection circuit (or circuits) facilitates the production of detailed information about events detected by the detection circuit (or detection circuits).

In some example embodiments, the detection circuit(s) can include a current transformer based detection circuit that includes a current transformer that detects short pulses when the at least one zener diode initially turns on. The current transformer can include a transformer coil that is rated for a maximum fault current as specified by an IS safety standard.

In another example embodiment, the detection circuit can include an opto-coupler based detection circuit that includes an opto-coupler that detects a period while the at least one zener diode is conducting. The opto-coupler is preferably rated for a maximum fault current as specified by an IS (Intrinsically Safe) safety standard.

In still another example embodiment, the detection circuit can be configured electronically as a shunt based detection circuit. In yet another example embodiment, two or more redundant circuit paths can be provided in which the same or different types of circuits are located to detect the same or different types of events. Examples of possible types of such events include long durations faults, surges that last over a particular length of time, fast transients, or a different amount of current.

In yet other example embodiments, a processor can be implemented, which processes at least one output from the at least one detection circuit. Such a processor can be, for example, an embedded processor, a microcontroller, and so on. In addition, in some example embodiments, an external monitoring device can be provided, which monitors at least one output from the detection circuit(s).

In still another example embodiment, a method of operating a circuit device can be implemented, which includes steps or operations such as configuring a zener diode barrier having at least one zener diode; and facilitating the production of detailed information about events detected by at least one detection circuit electronically in series with the zener diode (or zener diodes) of the zener diode barrier, wherein the zener diode barrier comprises an IS (Intrinsically Safe) barrier.

In yet another example embodiment, steps or operations can be implemented, such as: detecting short pulses when the at least one zener diode initially turns on, wherein the detection circuit(s) includes a current transformer based detection circuit comprising a current transformer that detects the short pulses; and/or detecting a period while the zener diode(s) is conducting. In such a method, the detection circuit can comprise an opto-coupler based detection circuit that includes an opto-coupler that detects the period. The current transformer includes a transformer coil that is rated for a maximum fault current as specified by an IS safety standard and the opto-coupler is rated for a maximum fault current as specified by the IS safety standard.

The preceding description of the disclosed embodiments is provided to enable any person skilled in the art to make or use such embodiments. Various modifications to these embodiments will be readily apparent to those skilled in the art, and the generic principles defined herein may be applied to other embodiments without departing from the spirit or scope of the invention. Thus, the disclosed embodiments are not intended to be limited to the embodiments shown herein, but are to be accorded the widest scope consistent with the following claims and the principles and novel features disclosed herein.

The invention claimed is:

1. A circuit device, comprising:
   a zener diode barrier having at least one zener diode among dual redundant zener diodes;
   at least one detection circuit that is connected electronically to a ground and which is electronically in series with said at least one zener diode of said zener diode barrier and provides a detection voltage, wherein said zener diode barrier comprises an IS (Intrinsically Safe) barrier having at least two redundant circuit paths, such that said at least one detection circuit facilitates a production of detailed information about events detected by said at least one detection circuit;
   wherein said at least one detection circuit comprises a current transformer based detection circuit that includes a current transformer that detects short pulses when said at least one zener diode initially turns on; and
   wherein said at least one detection circuit further comprises at least one of:
   a first detection circuit that detects long duration faults,
   a second detection circuit that detects surges over a length of time, and
   a third detection circuit that detects fast transients,
   wherein said first detection circuit, said second detection circuit and said third detection circuit are operable to detect different amounts of current, while providing information regarding said events including a severity of said long duration faults, said surges over said length of time, and said fast transients.

2. The device of claim 1 wherein said current transformer includes a transformer coil that is rated for a maximum fault current as specified by an IS safety standard and wherein said at least one zener diode among said dual redundant zener diodes regulates voltages to a maximum safe value as specified by said IS safety standard.

3. The device of claim 1 wherein said at least one zener diode is further connected electronically to an inductor fuse and a resistor.

4. The device of claim 1 further comprising a processor that processes at least one output from said at least one detection circuit.

5. The device of claim 4 wherein said processor comprises an embedded processor that uses a surface mount form factor.

6. The device of claim 4 wherein said processor comprises a microcontroller.

7. The device of claim 1 further comprising an external monitoring device that monitors at least one output from said at least one detection circuit.

8. A circuit device, comprising:
   a zener diode barrier having at least one zener diode among dual redundant zener diodes, wherein said at least one zener diode is connected electronically to an inductor fuse and a resistor;
   at least one detection circuit that is connected electronically to a ground and which is electronically in series with said at least one zener diode of said zener diode barrier and provides a detection voltage, wherein said zener diode barrier comprises an IS (Intrinsically Safe) barrier having at least two redundant paths, such that said at least one detection circuit facilitates a production of detailed information about events detected by said at least one detection circuit;
   a processor that processes at least one output from said at least one detection circuit;
   wherein said at least one detection circuit comprises a current transformer based detection circuit that includes a current transformer that detects short pulses when said at least one zener diode initially turns on; and
   wherein said at least one detection circuit further comprises at least one of:
      a first detection circuit that detects long duration faults,
      a second detection circuit that detects surges over a length of time, and
      a third detection circuit that detects fast transients,
   wherein said first detection circuit, said second detection circuit and said third detection circuit are operable to detect different amounts of current, while providing information regarding said events including a severity of said long duration faults, said surges over said length of time, and said fast transients.

9. The device of claim 8 wherein said current transformer includes a transformer coil that is rated for a maximum fault current as specified by an IS safety standard and wherein said at least one zener diode among said dual redundant zener diodes regulates voltages to a maximum safe value as specified by said IS safety standard.

10. The device of claim 8 wherein said possible types of events include long durations faults, surges that last over a particular length of time, fast transients, or a different amount of current.

11. A method of operating a circuit device, said method comprising:
   providing a zener diode barrier having at least one zener diode among dual redundant zener diodes; and
   facilitating a production of detailed information about events detected by at least one detection circuit that is connected electronically to a ground and which is electronically in series with said at least one zener diode of said zener diode barrier having at least two redundant circuit paths, wherein said zener diode barrier comprises an IS (Intrinsically Safe) barrier;
   wherein said at least one detection circuit comprises a current transformer based detection circuit that includes a current transformer that detects short pulses when said at least one zener diode initially turns on; and
   wherein said at least one detection circuit further comprises at least one of:
      a first detection circuit that detects long duration faults,
      a second detection circuit that detects surges over a length of time, and
      a third detection circuit that detects fast transients,
   wherein said first detection circuit, said second detection circuit and said third detection circuit are operable to detect different amounts of current, while providing information regarding said events including a severity of said long duration faults, said surges over said length of time, and said fast transients.

12. The method of claim 11 further comprising:
   detecting short pulses when said at least one zener diode initially turns on, wherein said at least one detection circuit comprises a current transformer based detection circuit comprising a current transformer that detects said short pulses; and
   detecting a period while said at least one zener diode is conducting, wherein said detection circuit comprises an opto-coupler based detection circuit that includes an opto-coupler that detects said period, wherein said current transformer includes a transformer coil that is rated for a maximum fault current as specified by an IS safety standard and wherein said opto-coupler is rated for a maximum fault current as specified by said IS safety standard.

* * * * *